US008265302B2

(12) United States Patent
Salgueiro et al.

(10) Patent No.: US 8,265,302 B2
(45) Date of Patent: Sep. 11, 2012

(54) METHOD AND APPARATUS FOR PROVIDING VOLUME CONTROL WITH DC SUPERVISION

(75) Inventors: David John Salgueiro, Cranford, NJ (US); Victor E. Cappetta, Jr., Atlantic Highlands, NJ (US)

(73) Assignee: Cooper Technologies Company, Houston, TX (US)

( * ) Notice: Subject to any disclaimer, the term of this patent is extended or adjusted under 35 U.S.C. 154(b) by 1134 days.

(21) Appl. No.: 11/688,813

(22) Filed: Mar. 20, 2007

(65) Prior Publication Data

US 2008/0232613 A1 Sep. 25, 2008

(51) Int. Cl.
*H03G 3/00* (2006.01)

(52) U.S. Cl. ............ 381/109; 381/104; 381/77; 381/81; 381/123; 340/506

(58) Field of Classification Search .................... 381/77, 381/79–82, 104–105, 109, 123; 340/506, 340/286.02, 291, 286
See application file for complete search history.

(56) References Cited

U.S. PATENT DOCUMENTS

| | | | | |
|---|---|---|---|---|
| 5,054,076 | A * | 10/1991 | Lowell | 381/109 |
| 6,125,188 | A * | 9/2000 | Hennessy | 381/98 |
| 6,580,789 | B1 * | 6/2003 | Simpson et al. | 379/114.02 |
| 2003/0080865 | A1 * | 5/2003 | Capowski et al. | 340/506 |

* cited by examiner

*Primary Examiner* — Disler Paul

(57) ABSTRACT

A method and apparatus for providing a volume control with DC supervision in a voice evacuation system are disclosed. In one embodiment, the apparatus is a volume control comprising a first input interface for receiving an audio signal, a first output interface for forwarding said audio signal to at least one audio device, and a second input interface for receiving an alarm signal. The apparatus also comprises a switch having a plurality of nodes, wherein at least one of the plurality of nodes is an unlabeled node, wherein the switch is in communication with the first input interface and the first output interface for controlling a volume of the audio signal that is sent to the at least one audio device. The apparatus also comprises a filter that is coupled to the unlabeled node of the switch.

20 Claims, 5 Drawing Sheets

METHOD AND APPARATUS FOR PROVIDING VOLUME CONTROL WITH DC SUPERVISION

BACKGROUND OF THE INVENTION

1. Field of the Invention

The present invention relates to an apparatus and concomitant method for providing a volume control with DC supervision and an alarm by-pass circuit in an emergency voice evacuation system. More specifically, the present invention provides a volume control that allows users to control the volume of paging and background music while maintaining supervision in an emergency voice evacuation system.

2. Description of the Related Art

An emergency voice evacuation system for a facility is often designed to drive a certain number of notification appliances, e.g., audio notification appliances, visual notification appliances and both audio and visual notification appliances. In operation, paging and/or background music can be implemented into the emergency voice evacuation system as well. Volume control of each zone of the emergency voice evacuation system is desirable when the system is used for paging and/or playing background music during non-alarm conditions.

However, when using a volume control in an emergency voice evacuation system, the volume control must be able to pass DC supervision. Volume controls currently used in emergency voice evacuation systems may not be able to provide continuous supervision of the emergency voice evacuation system when they are not properly used, e.g. when the volume control switch is placed at certain settings, such as for example, when the volume control is moved in between two consecutive nodes or at a last unlabeled node of the volume control. Consequently, in such positions of the volume controls currently used, a voice evacuation panel may erroneously detect that supervision is lost when, in fact, there is nothing wrong with the circuits of the emergency voice evacuation system. Unfortunately, when the volume control is improperly set, an alarm or alert is generated requiring a technician to respond immediately. The technician may be required to come on site to simply move a switch on the volume control to a proper node, thereby wasting valuable time and resources.

Thus, there is a need for a method and apparatus for providing volume control with continuous DC supervision and an alarm by-pass circuit in an emergency voice evacuation system that is capable of maintaining supervision at any setting of the volume control.

SUMMARY OF THE INVENTION

The present invention generally discloses a method and apparatus for providing a volume control with DC supervision. In one embodiment, the apparatus is a volume control comprising a first input interface for receiving an audio signal, a first output interface for forwarding said audio signal to at least one audio device and a second input interface for receiving an alarm signal. The apparatus also comprises a shorting type switch having a plurality of nodes, where the shorting type switch is in communication with the first input interface and the first output interface for controlling a volume of the audio signal that is sent to the at least one audio device.

In an alternate embodiment, the apparatus is a volume control comprising a first input interface for receiving an audio signal, a first output interface for forwarding said audio signal to at least one audio device, and a second input interface for receiving an alarm signal. The apparatus also comprises a switch having a plurality of nodes, wherein at least one of the plurality of nodes is an unlabeled node, wherein the switch is in communication with the first input interface and the first output interface for controlling a volume of the audio signal that is sent to the at least one audio device. The apparatus also comprises a filter that is coupled to the unlabeled node of the switch.

In an alternate embodiment, the apparatus is a volume control comprising: a first input interface for receiving an audio signal, a first output interface for forwarding said audio signal to at least one audio device, and a second input interface for receiving an alarm signal. The apparatus further comprises a switch having a plurality of nodes, wherein at least one of said plurality of nodes is a common node, wherein the switch is in communication with the first input interface and the first output interface for controlling a volume of the audio signal that is sent to the at least one audio device. The apparatus further comprises a filter that is coupled to the common node of the switch.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

The present invention generally discloses a volume control that can maintain continuous supervision of an emergency voice evacuation system at any position of the volume control. The ability to provide volume control of each zone of the paging and/or background music in non-alarm conditions while maintaining supervision is desirable. Maintaining supervision ensures that devices in the emergency voice evacuation system, such as for example, visual notification appliances, audio notification appliances and audio devices, such as speakers, are in a ready state and functional. A general description of the supervision of the emergency voice evacuation system is discussed in further detail below with reference to FIG. 2.

In one embodiment, the volume control may meet the Underwriters Laboratories (UL) listed standards for emergency voice evacuation systems. For example, devices in emergency voice evacuation systems may be required to meet UL 864 requirements.

To maintain continuous supervision of an emergency voice evacuation system, the volume control must be able to allow supervision while a switch of the volume control is set at any position. For example, current volume controls may lose supervision when a non-shorting type switch of the volume control is set in a position between two consecutive settings of the volume control or when the switch is moved to a last unlabeled node of the volume control. A non-shorting type switch will break a connection before a next connection is made. For example, in a rotary non-shorting type switch, turning the knob of the switch between a first setting to a second setting will cause contact with the first switch to break before making contact with the second setting. In other words, the contacts are temporarily disconnected before making contact with the next set of contacts. Thus, if the knob is set at a position between two settings, then no connection is made and it will appear that the non-shorting type switch has created an open circuit. Consequently, when this occurs, a notification panel or voice evacuation panel may alert a technician of a potential problem. Thus, a technician may be required to address the problem within a time period specified by code, e.g. within a few hours, which usually requires the technician to go on-site and simply move the volume control out of the "in between" setting. As a result, valuable time and resources are wasted and the technician is highly inconvenienced.

In one embodiment, the present invention addresses this problem by providing a volume control method and apparatus for a volume control with continuous supervision and an alarm by-pass circuit in an emergency voice evacuation system that is capable of maintaining continuous supervision with the switch of the volume control at any position. In one embodiment, the volume control may be within the UL listed standards for emergency voice evacuation systems, for example UL 864 requirements.

Figure 1:
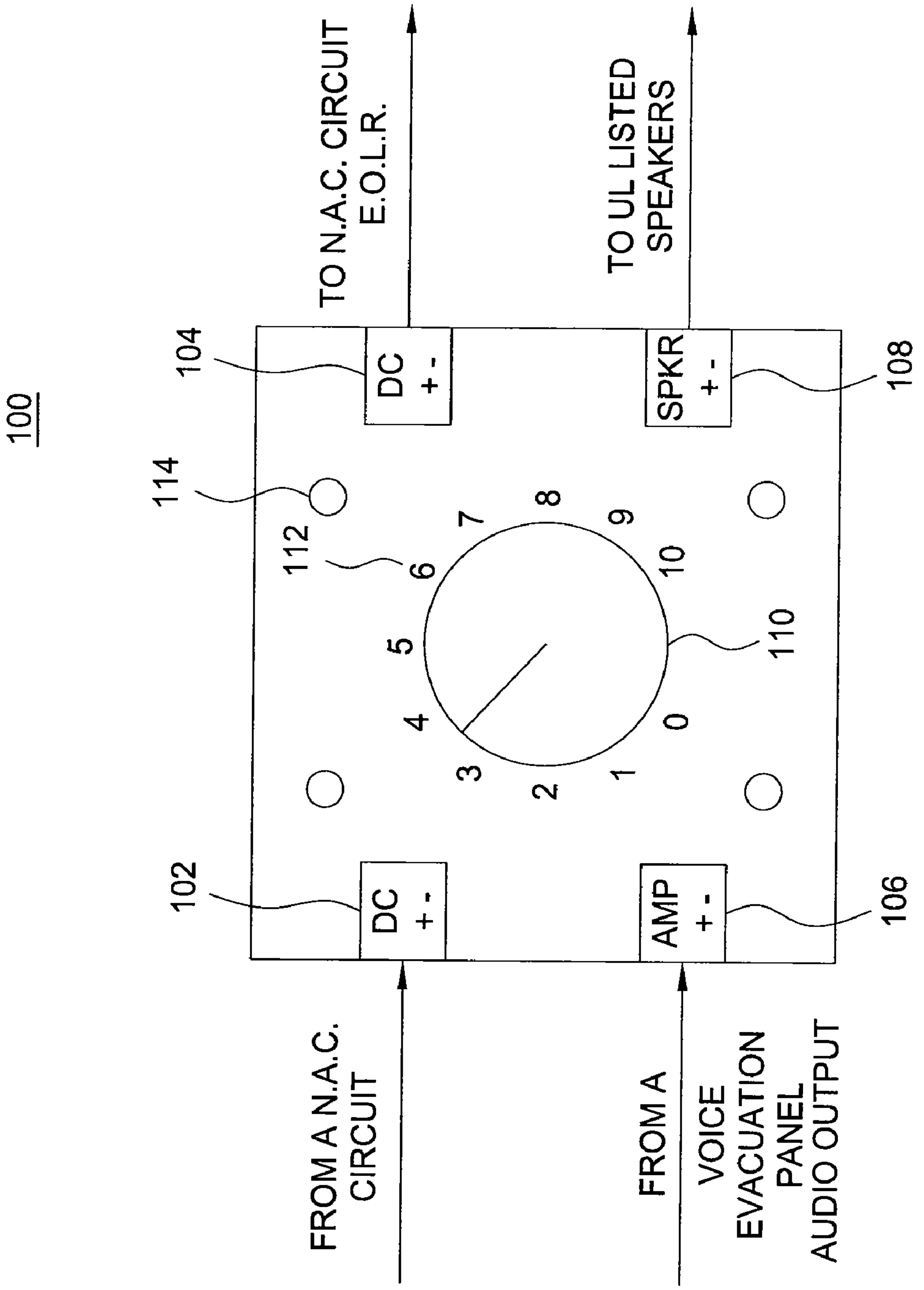
FIG. 1 is a block diagram of an exemplary volume control of the present invention.

FIG. 1 is a block diagram of an exemplary volume control 100 of the present invention. The volume control 100 may include a direct current (DC) input interface 102 and a DC output interface 104. DC input interface 102 may receive a DC signal sent from a voice evacuation panel over a notification appliance circuit (NAC). For example, DC output interface 104 may pass the input signal received via DC input interface 102 to power or activate various NAC devices (not shown) wired in series such as, for example, strobes, alarms, horns or any other emergency evacuation signaling devices. The NAC employs an end of line resistor (EOLR) that is used to assist in the supervision of the NAC.

In one embodiment a NAC pass through is provided between the DC input interface 102 and DC output interface 104. The NAC pass through allows any current setting on the volume control 100 to be by-passed if an alarm state is detected such that the emergency voice evacuation system is set to a maximum volume. The NAC pass through is discussed in further detail below with reference to FIG. 3.

The volume control 100 may also include an input interface 106 for receiving alternating current (AC) signals such as, for example, audio signals. The volume of the AC signal may be controlled via the volume control 100 before being outputted to audio devices such as speakers, e.g. fire rated and UL listed speakers via output interface 108. An audio circuit may also employ an EOLR, similar to the NAC for providing supervision of the audio circuit. Input interface 106 may be connected to an audio output of any voice evacuation panels, audio systems and audio boosters such as, for example, a SAFEPATH® system from Cooper Wheelock Industries of Long Branch, N.J. Exemplary SAFEPATH® systems may be, but not limited to, safe path system model numbers SPB-80/4, SPB-160, SPB-320, SP4-APS or SP4Z-A/B all manufactured by Cooper Wheelock Industries of Long Branch, N.J.

Volume control 100 also includes a switch 110 having a plurality of nodes or settings 112. The switch 110 controls the volume audio signals received via input interface 106 by adjusting the switch 110 to one of the plurality of nodes 112. The switch 110 may be any type of switch such as, for example, a rotary switch or sliding switch. In one embodiment, the switch is a shorting type switch. A shorting type switch will "make before break." In other words, a shorting type switch is one which the next contact is made before a previous contact is broken. In an exemplary embodiment, as illustrated in FIG. 1, an industry standard twelve position shorting type rotary switch with twelve nodes may be used (note node 11, i.e. the $12^{th}$ position is unlabeled per industry standards).

To install the volume control 100, a plurality of mounting holes 114 may be provided. Although the mounting holes 114 are illustrated in FIG. 1 as being double gang, one skilled in the art will recognize that mounting holes 114 may also be provided in a single gang position or in any other configuration as required by deployment requirements.

Figure 2:
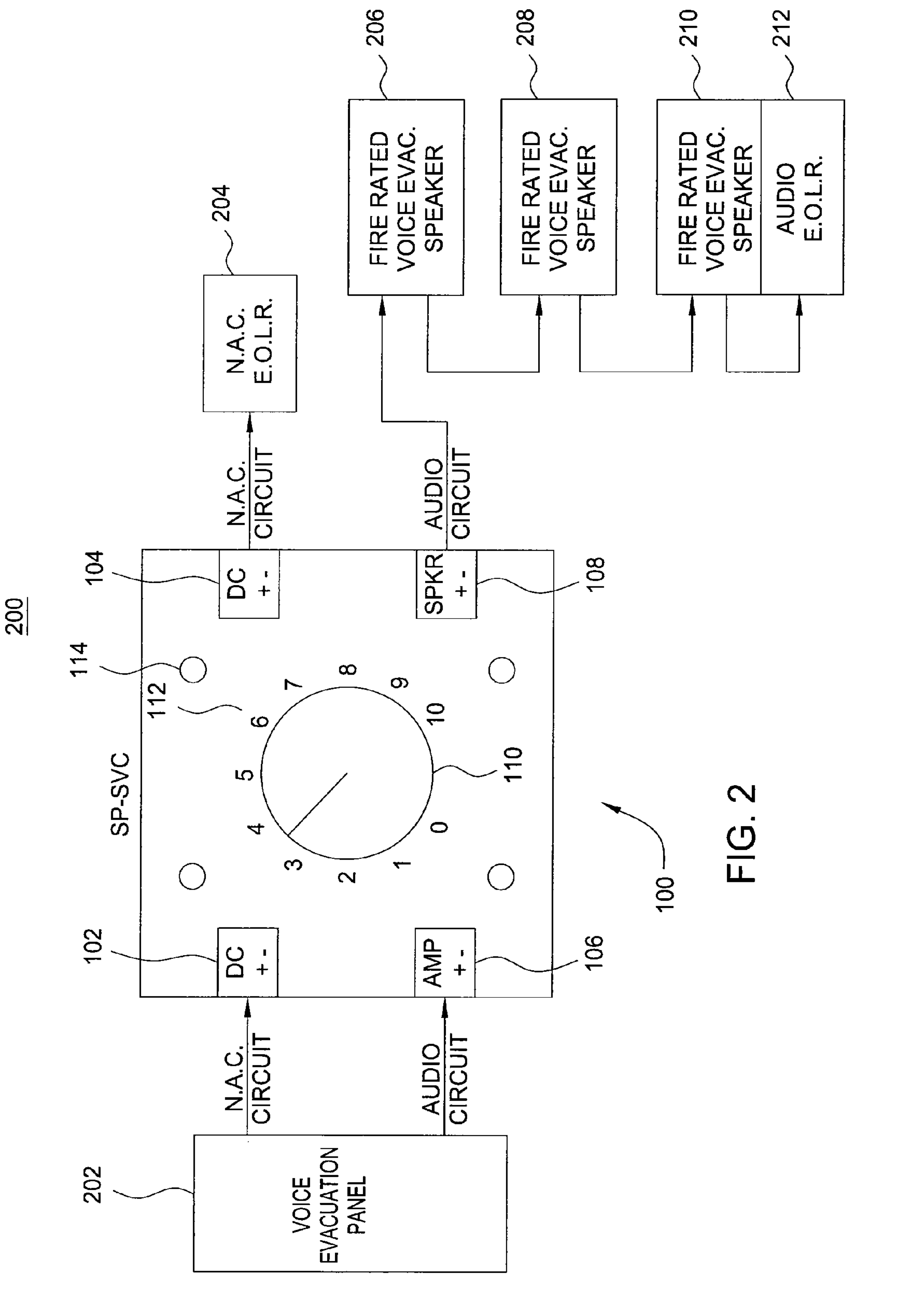
FIG. 2 is a block diagram of an exemplary voice evacuation system using a volume control of the present invention.

FIG. 2 illustrates a block diagram of an exemplary emergency voice evacuation system 200 using the volume control 100 of the present invention. FIG. 2 illustrates a voice evacuation panel 202 connected to volume control 100. As discussed above, a voice evacuation panel 202 may be, for example, a SAFEPATH® system manufactured by Cooper Wheelock Industries of Long Branch, N.J. Generally, a NAC may carry a DC signal from the voice evacuation panel 202 to DC input interface 102 of the volume control 100 and the DC signal is outputted via DC output interface 104 to power or activate various NAC devices (not shown). As discussed above, NAC devices may be, for example, strobes, alarms, horns or any other emergency evacuation signaling devices. NAC devices may be wired in series and terminate at a NAC EOLR 204. In an exemplary embodiment, the NAC EOLR 204 may be co-located with the last NAC device. The DC signal from the voice evacuation panel 202 may also be used for supervision as will be discussed below.

Voice evacuation panel 202 also sends an audio signal via an audio output to input interface 106 of volume control 100. As discussed above, the emergency voice evacuation system 200 may be used for paging and/or playing background music during non-alarm conditions. When used for paging and/or playing background music, volume control 100 may control the volume of the audio signal via switch 110 by moving switch 110 to a desired volume setting represented by the plurality of nodes 112. The audio signal may then be outputted at the desired volume via output interface 108 to one or more audio devices such as speakers, e.g. fire rated and UL listed speakers 206, 208 and 210. Although only three audio devices are shown, one skilled in the art will recognize that the present invention is not limited to three audio devices and that any number of audio devices may be used.

In an exemplary embodiment of the present invention to provide supervision of emergency voice evacuation system 200, the audio circuit of speakers 206, 208 and 210 may be wired in series, and terminate at an EOLR 212, similar to the NAC terminating at NAC EOLR 204. In an exemplary embodiment, the EOLR 212 may be co-located with the last speaker 210. Voice evacuation panel 202 continuously supplies a small amount of DC, as discussed above, through the NAC devices to the NAC EOLR 204 and speakers 206, 208 and 210 to EOLR 212. As a result, voice evacuation panel 202 may continuously monitor the emergency voice evacuation system 200 to ensure that the resistance values of the NAC EOLR 204 and EOLR 212 of the audio circuit are always detected. For example, the EOLRs may have a value of 10,000 ohms. Any change in resistance value detected by voice evacuation panel 202 in emergency voice evacuation system 200, due to either a short or open circuit, may indicate a potential problem in either the NAC or the audio circuit. For example, if the detected resistance value changes from 10,000 ohms to an infinite resistance, voice evacuation panel 202 may alert a technician that there may be a potential problem in the circuitry of emergency voice evacuation system 200. The exemplary volume control 100 of the present invention may be configured as described herein, such that when volume control 100 is used in the emergency voice evacuation system 200, the DC signal may be passed no matter what position switch 110 of volume control 100 is in to maintain supervision of the emergency evacuation system 200.

In addition, although only one volume control 100 is illustrated in FIG. 2, one skilled in the art will recognize that the present invention is not limited to a single volume control 100. For example, volume control 100 may be installed in each zone of the emergency voice evacuation system 200. Consequently, each volume control 100 may control the volume of each respective zone of the emergency voice evacuation system 200 independently when used for paging and/or playing background music during non-alarm conditions.

Figure 3:
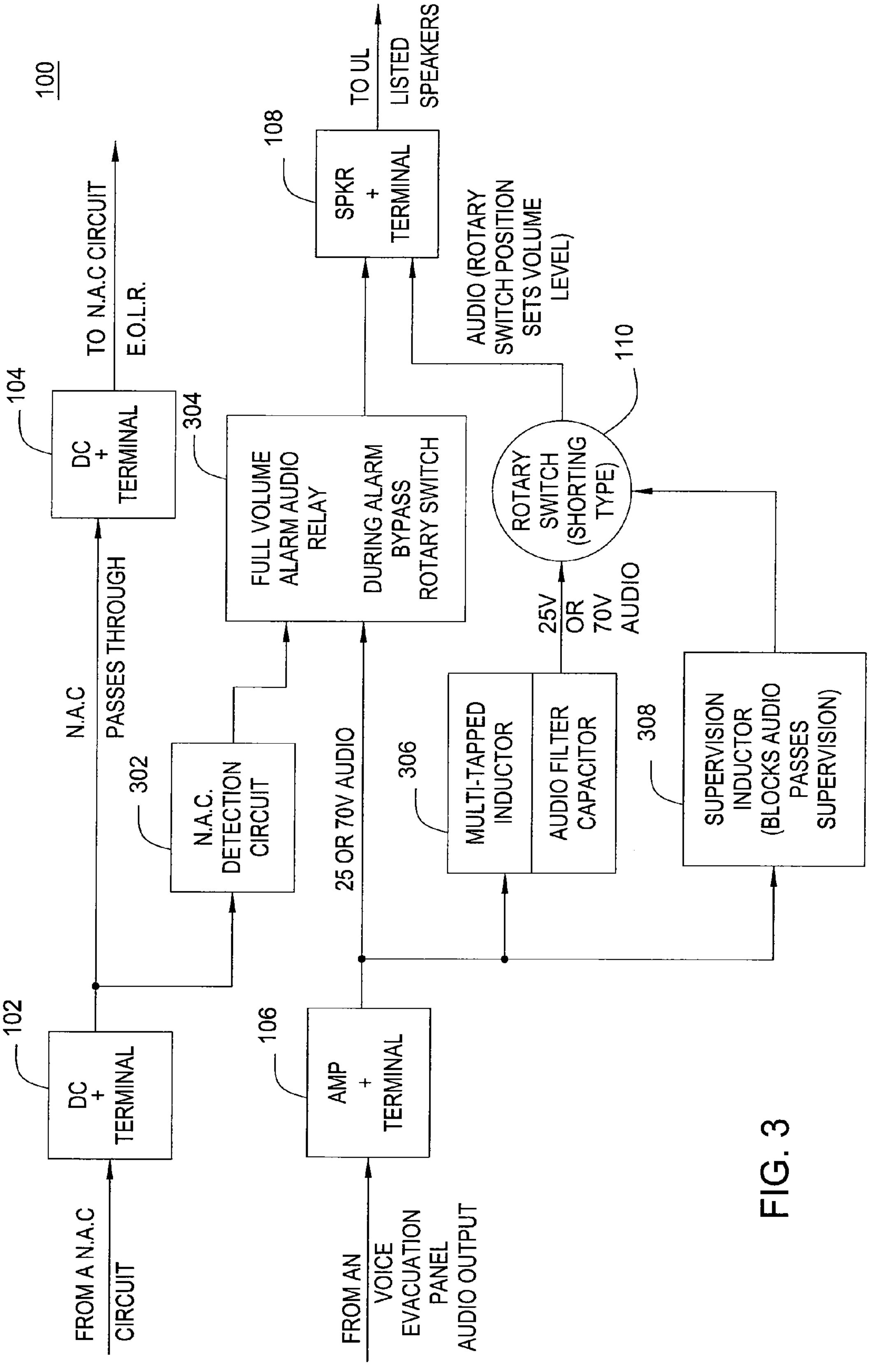
FIG. 3 is a functional block diagram of an exemplary volume control of the present invention.

FIG. 3 illustrates a functional block diagram of an exemplary volume control 100 of the present invention. As noted above, FIG. 3 illustrates the DC pass through in more detail. Volume control 100 may include a NAC signal detection circuit 302 and a relay 304. NAC signal detection circuit 302 may detect an alarm signal transmitted over the NAC. For example, if an alarm condition is triggered the NAC signal detection circuit 302 may detect the alarm when the DC signal received at input interface 102 changes from an −8 volt signal that may be used for supervision to a 24 volt signal with high current that may be used to signify an alarm state. When such change is detected by NAC signal detection circuit 302, NAC signal detection circuit 302 may trigger relay 304 to by-pass the switch 110. Consequently, during an alarm state, the audio signal received via input interface 106 is passed to the fire rated and UL listed speakers 206, 208 and 210 via output interface 108 at maximum volume.

In non-alarm conditions when no alarm state is detected, switch 110 may be used to control the volume of the audio signal received via input interface 106. However, since volume control 100 is a part of the circuit path of emergency voice evacuation system 200 when used in an emergency situation, it must be operated in a manner that allows supervision to be maintained by passing the DC signal sent by the voice evacuation panel 202. Consequently, any short or open circuit created in volume control 100 will also prevent the voice evacuation panel 202 from detecting the EOLRs, thereby causing an alert or alarm to be sent to a technician. Therefore, the switch 110 must maintain a circuit path in any position including, but not limited to, positions in between two consecutive nodes and/or the last unlabeled node.

One way to accomplish this in an exemplary embodiment of the present invention is using a shorting type switch for switch 110. As discussed above, shorting type switches make a connection before breaking the previous connection when the switch is moved from one node to another node. Consequently, even if the switch 110 is placed in between two consecutive nodes, the voice evacuation panel 202 will not detect a short or open circuit during supervision.

Shorting type switches, e.g. shorting type rotary switches, may use a multi-tapped inductor 306 for each one of the plurality of nodes 112 of switch 110. Multi-tapped inductor 306 may act as a filter to adjust the volume of the audio signal received via input interface 106 at each node of the plurality of nodes 112 of switch 110. However, currently used shorting type rotary switches in emergency voice evacuation systems 200 may have a last unlabeled node that is not connected to the multi-tapped inductor 306. For example, the last unlabeled node may be an eleventh position. One skilled in the art will recognize that the last unlabeled node may be any last node irrespective of the number of nodes. Consequently, in the currently used shorting type rotary switches, if a user moves the switch 110 to the last node (e.g. the eleventh position of positions 0-11 in an industry standard 12 position shorting type rotary switch), the user may create a short in the circuit. As a result, the volume control 100 will not be able to pass the DC signal used for supervision and the voice evacuation panel 202 will alert or alarm a technician of a possible problem in the emergency voice evacuation system 200.

To resolve this problem, in one embodiment the last node may be connected to a supervision inductor 308. Supervision inductor 308 may act as a filter to allow the DC signal to pass through to maintain supervision, but may block the AC signal such as, for example, audio signals. As discussed above, currently used shorting type rotary switches may create a short or an open circuit when switch 110 is moved to the last node. However, by inserting a supervision inductor 308 coupled to the last node, no short circuits are created even when switch 110 is moved in between two consecutive nodes or moved to the last node. Consequently, the volume control 100 may maintain supervision with the switch 110 at any position of the plurality of nodes 112.

In addition, to resolve the short created by moving switch 110 of shorting type rotary switches to the last node, a barrier may be placed after the last labeled node (e.g. the tenth position in an industry standard 12 position shorting type rotary switch) to prevent the switch from being able to move to the last node, thereby causing a short.

Figure 4:
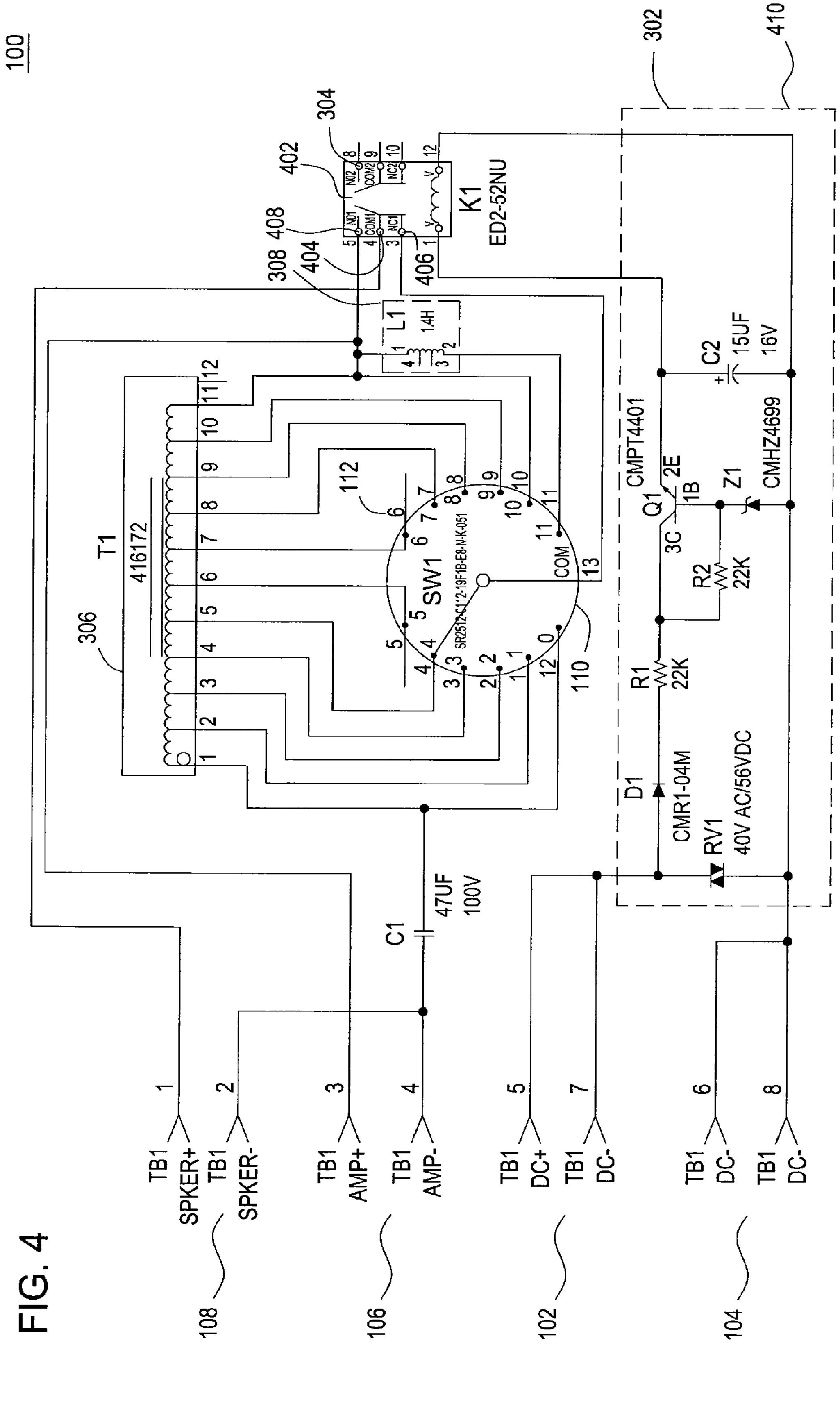
FIG. 4 is a schematic diagram of one embodiment of the present volume control.

FIG. 4 illustrates an exemplary schematic diagram of one embodiment of a volume control 100 of the present invention. An exemplary implementation for a NAC signal detection circuit 302 is represented by the portion of FIG. 4 encompassed by dashed lines 410. As discussed with reference to FIG. 3, NAC signal detection circuit 302 may detect an alarm signal transmitted over the NAC when an alarm condition is triggered. When an alarm signal is detected by NAC signal detection circuit 302, relay 304 may be triggered to by-pass switch 110.

As illustrated in FIG. 4, relay 304 may have a see-saw type switch 402 that either completes a circuit path between contacts 404 and 406 or contacts 404 and 408. For example, in a non-alarm state, the audio signal that may be received via input interface 106 may travel through the multi-tapped inductor 306 at the appropriate volume level to the speakers 206, 208 and 210 via the output interface 108 and the circuit path is completed via contacts 404 and 406. However, when an alarm state is detected and relay 304 is triggered, switch 402 may move to complete a circuit path between contacts 404 and 408. Consequently, the audio signal that may be received via input interface 106 is forced to travel through the multi-tapped inductor 306 and out at the maximum volume setting to the speakers 206, 208 and 210 via the output interface 108 via contacts 404 and 408.

Moreover, to prevent a short when the switch 110 is moved to the last node, supervision inductor 308 may be coupled to the last node. The supervision inductor 308 should have a high enough inductance to block the AC signal while allowing the DC signal to pass through. For example, supervision inductor 308 may have an inductance of approximately 1.4

Henries (H). As a result, when the switch 110 is moved to the last node, such as an unlabeled eleventh node in an industry standard 12 position shorting type rotary switch, the supervision inductor 308 may act as a filter to block the AC signal, such as an audio signal, while allowing the DC signal, such as a supervision DC current, to pass through, thereby avoiding a short.

Figure 5:
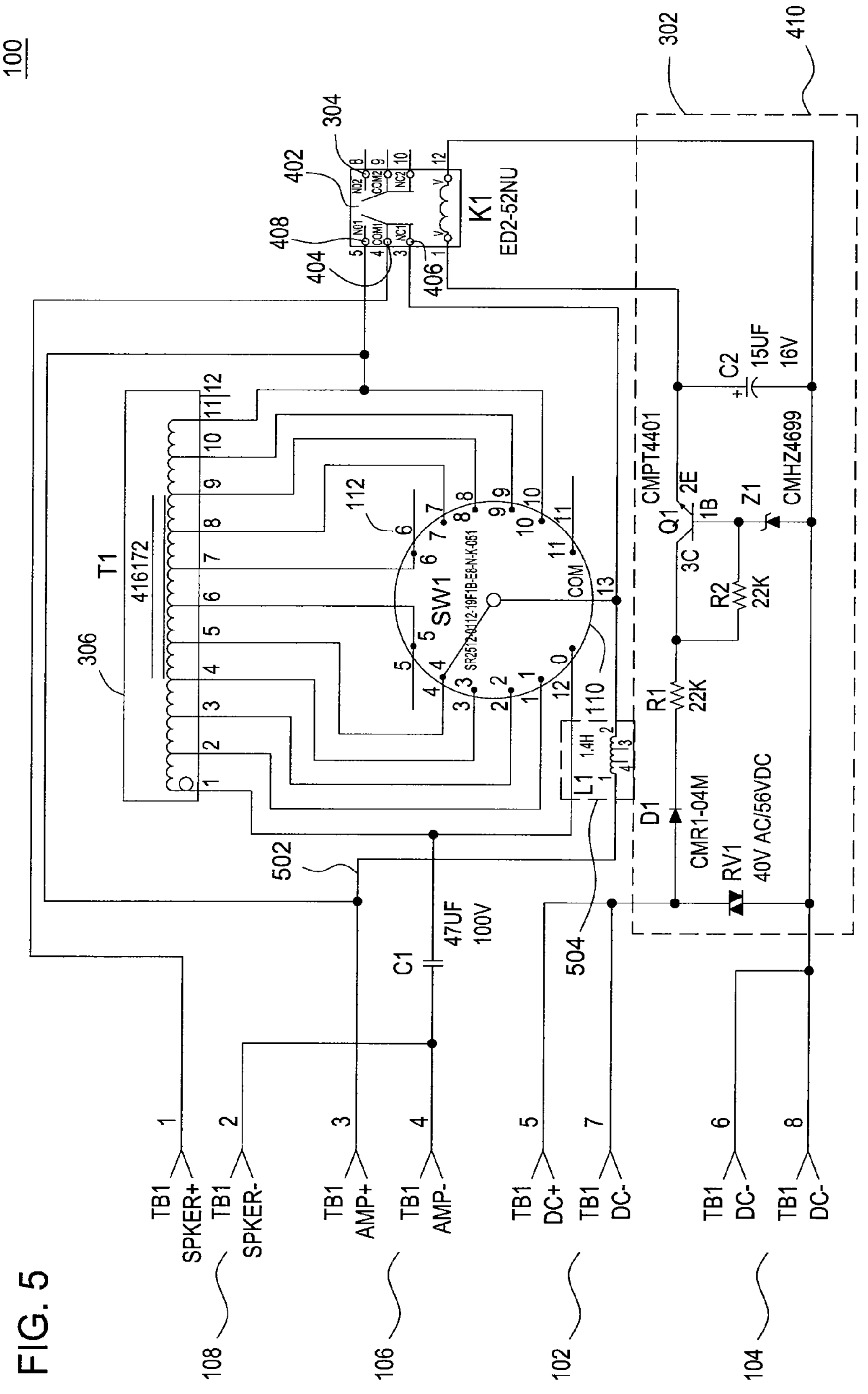
FIG. 5 is a schematic diagram of an alternate embodiment of the present volume control.

Notably, as discussed above, an alternate embodiment of the present invention may also use non-shorting type rotary switches or sliding switches. FIG. 5 illustrates an alternate embodiment of the present invention. In an alternate embodiment, switch 110 may be a non-shorting type rotary switch. Non-shorting type rotary switches, as previously used, break the current circuit path before making a new circuit path. Consequently, an open circuit is created when a switch 110 of a non-shorting type rotary switch is placed in between two consecutive nodes, thereby preventing the DC signal used for supervision to pass through and causing voice notification panel 202 to detect a potential problem in emergency voice evacuation system 200.

To resolve this issue, a circuit or circuit portion 502 having a supervision inductor 504 may be used, as illustrated in FIG. 5. Circuit 502 having a supervision inductor 504 allows the DC signal used for supervision to pass even though no audio may pass when switch 110 is moved to a position in between two consecutive nodes. The circuit 502 may be split off of one of the incoming AC signals and connect to the common (COM) node of switch 110. Namely, a filter 504, e.g., an inductor, is coupled to the common node of the non-shorting type switch. As a result, the circuit 502 having a supervision inductor 504 prevents open circuits and/or shorts from being created when a switch 110 of a non-shorting type rotary switch is placed in between any two consecutive nodes. Consequently, DC supervision is still maintained.

It should be noted that various interfaces disclosed above can be implemented using various terminals and/or circuit components. As such, the figures showing these various interfaces are only illustrative.

It should be noted that the present disclosure provides various numerical values that are only exemplary. Those skilled in the art will realize that other values may be applicable and thus, these exemplary values should not be viewed as a limitation of the present invention.

While the foregoing is directed to embodiments of the present invention, other and further embodiments of the invention may be devised without departing from the basic scope thereof, and the scope thereof is determined by the claims that follow.

What is claimed is:

1. A volume control, comprising:
- a first input interface for receiving an audio signal in an alternating current (AC) signal;
- a first output interface for forwarding said audio signal to at least one audio device;
- a second input interface for receiving an alarm signal in a direct current (DC) signal, wherein the alarm signal provides supervision of a notification appliance circuit; and
- a shorting type switch having a plurality of nodes, said shorting type switch is in communication with said first input interface and said first output interface for controlling a volume of said audio signal that is sent to said at least one audio device.

2. The volume control of claim 1, further comprises:
- a detection circuit coupled to said second input interface for detecting said alarm signal; and
- a relay coupled to said detection circuit for bypassing said shorting type switch when said alarm signal is detected by said detection circuit.

3. The volume control of claim 2, wherein said relay bypasses said shorting type switch to set said volume control at a maximum volume.

4. The volume control of claim 1, further comprising:
- at least one filter that is coupled to each one of said plurality of nodes of said shorting type switch.

5. The volume control of claim 4, wherein said at least one filter is a multi-tapped inductor.

6. The volume control of claim 4, wherein an unlabeled node of said shorting type switch is coupled to said at least one filter.

7. The volume control of claim 6, wherein said at least one filter comprises a single multi-tapped inductor that is coupled to said plurality of nodes of said shorting type switch and a separate inductor that is coupled to said unlabeled node of said shorting type switch.

8. The volume control of claim 4, wherein said at least one filter allows the DC to pass through while preventing the AC from passing through.

9. A volume control, comprising:
- a first input interface for receiving an audio signal in an alternating current (AC) signal;
- a first output interface for forwarding said audio signal to at least one audio device;
- a second input interface for receiving an alarm signal in a direct current (DC) signal, wherein the alarm signal provides supervision of a notification appliance circuit;
- a switch having a plurality of nodes, wherein at least one of said plurality of nodes is an unlabeled node, wherein said switch is in communication with said first input interface and said first output interface for controlling a volume of said audio signal that is sent to said at least one audio device; and
- a first filter that is coupled to said unlabeled node of said switch.

10. The volume control of claim 9, wherein said first filter is an inductor.

11. The volume control of claim 9, further comprises:
- a detection circuit coupled to said second input interface for detecting said alarm signal; and
- a relay coupled to said detection circuit for bypassing said switch when said alarm signal is detected by said detection circuit.

12. The volume control of claim 11, wherein said relay bypasses said switch to set said volume control at a maximum volume.

13. The volume control of claim 9, further comprising:
- at least one second filter that is coupled to said switch.

14. The volume control of claim 13, wherein said at least one second filter is a multi-tapped inductor.

15. The volume control of claim 14, wherein said at least one second filter allows the DC to pass through while preventing the AC from passing through.

16. The volume control of claim 9, wherein said switch is a shorting type switch.

17. The volume control of claim 9, wherein said switch is a non-shorting type switch.

18. A volume control, comprising:
- a first input interface for receiving an audio signal in an alternating current (AC) signal;
- a first output interface for forwarding said audio signal to at least one audio device;

a second input interface for receiving an alarm signal in a direct current (DC) signal, wherein the alarm signal provides supervision of a notification appliance circuit;

a switch having a plurality of nodes, wherein at least one of said plurality of nodes is a common node, wherein said switch is in communication with said first input interface and said first output interface for controlling a volume of said audio signal that is sent to said at least one audio device; and a first filter that is coupled to said common node of said switch.

19. The volume control of claim 18, wherein said first filter is an inductor.

20. The volume control of claim 19, wherein said switch is a non-shorting type switch.

* * * * *